(12) United States Patent
Jeong

(10) Patent No.: US 6,259,754 B1
(45) Date of Patent: Jul. 10, 2001

(54) PHASE FREQUENCY DETECTION CIRCUIT AND METHOD FOR LIQUID CRYSTAL DISPLAY

(75) Inventor: Tae Bo Jeong, Yongin (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/105,744

(22) Filed: Jun. 26, 1998

(30) Foreign Application Priority Data

Jun. 30, 1997 (KR) ................................. 97-30442

(51) Int. Cl.[7] ........................................ H03D 3/24
(52) U.S. Cl. .............. 375/375; 375/373; 327/3; 327/12; 331/11
(58) Field of Search .................. 375/375, 373, 375/376; 327/3, 12, 5, 1; 331/11, 12, 4, 25

(56) References Cited

U.S. PATENT DOCUMENTS

| | | | |
|---|---|---|---|
| 4,580,107 | * | 4/1986 | Caldwell et al. .................. 331/10 |
| 4,749,960 | * | 6/1988 | Mower et al. ...................... 331/4 |
| 5,384,551 | * | 1/1995 | Kennedy et al. .................. 331/17 |
| 5,640,523 | | 6/1997 | Williams ........................... 375/360 |

* cited by examiner

Primary Examiner—Stephen Chin
Assistant Examiner—Mohammad Ghayour
(74) Attorney, Agent, or Firm—Selitto, Behr & Kim

(57) ABSTRACT

A phase frequency detection circuit of a phase locked loop (PLL) for liquid crystal display which compares a phase between an external synchronous signal and an internal synchronous signal from the PLL to generate a phase difference detection signal, including: a dividing circuit for dividing the external synchronous signal and the horizontal synchronous signal; a phase difference detecting circuit for detecting the phase difference between the divided external synchronous signal and the divided horizontal synchronous signal from the dividing circuit; a phase discriminating circuit for discriminating whether the divided external synchronous signal is ahead of the divided horizontal synchronous signal and generating the phase discriminating signal; and a comparison device for receiving the phase difference detection signal from the phase difference detection circuit and the phase discriminating signal from the phase discriminating circuit to generate the phase frequency difference signal.

16 Claims, 5 Drawing Sheets

FIG.4
(PRIOR ART)
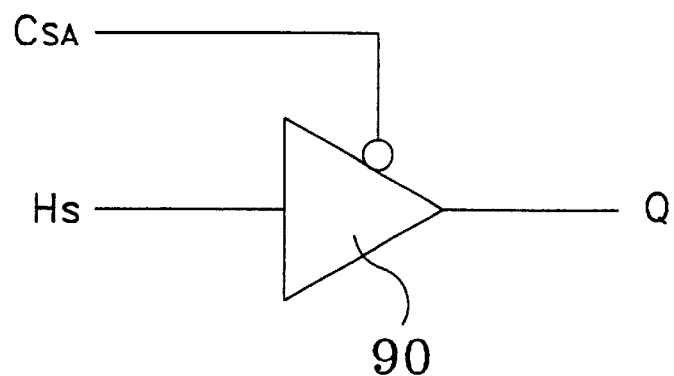
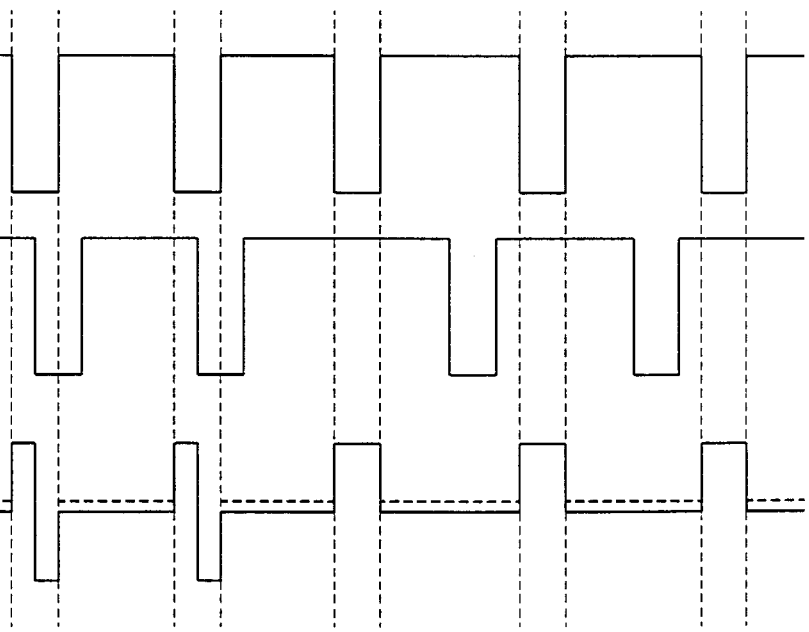
FIG.5A
(PRIOR ART)
CsA
FIG.5B
(PRIOR ART)
HsA
FIG.5C
(PRIOR ART)
PFD

PHASE FREQUENCY DETECTION CIRCUIT AND METHOD FOR LIQUID CRYSTAL DISPLAY

BACKGROUND OF THE INVENTION

This invention relates to a phase-locked loop (PLL) for liquid crystal displays (LCDs) which generates a master clock signal, and more particularly to a phase frequency detection circuit and a method for detecting the phase frequency difference between an external synchronous signal and a horizontal synchronous signal from the PLL with accuracy.

In general, a conventional phase-locked loop (PLL) for generating a master clock signal MCLK for LCDs is shown in FIG. 6. In the conventional PLL, the phase frequency detector 100 compares the phase between an external synchronous signal Csa and a horizontal synchronous signal Hs from a horizontal synchronous signal generator 500 to generate a phase frequency difference signal PFD. A voltage controlled-oscillator 400 varies its oscillation frequency with the phase frequency difference signal PFD received from the phase frequency detector 100 through a low pass filter LPF 200 and a buffer 300 to generate a master clock signal MCLK. A horizontal synchronous signal generator 500 generates the horizontal synchronous signal Hs to the phase frequency detector 100 in accordance with the master clock signal MCLK. At this time, the external synchronous signal Csa which is externally provided to the phase frequency detector 100 is a signal where video signal, equalization pulse signal and vertical synchronous signal are removed from the composite synchronous signal by using a RC constant of a multivibrator.

The prior phase frequency detector 100 used in the PLL is comprised of a three-state buffer as shown in FIG. 4. The three-state buffer 90 of the prior phase frequency detector 100 is enabled in the low state period of the external synchronous signal Csa as shown in FIG. 5A to output the horizontal synchronous signal Hs as shown in FIG. 5B received from the horizontal synchronous signal generator 500 and is disabled in the high state period of the external synchronous signal Csa, thereby being high impedance. Accordingly, the three-state buffer 90 generates the phase frequency difference signal PFD as shown in FIG. 5C.

However, the prior phase frequency detector 100 compares the phase between the external synchronous signal Csa and the horizontal synchronous signal Hs to generate the phase frequency difference signal PFD only when the external synchronous signal Csa is in low state. Therefore, it is impracticable to detect the phase frequency difference between the external synchronous signal Csa and the horizontal synchronous signal Hs with accuracy, unless the horizontal synchronous signal Hs is overlapped with the external synchronous signal Csa of low state. In addition, if the period of the external synchronous signal Csa is different from that of the horizontal synchronous signal Hs, the phase frequency detector 100 detects the undesired phase frequency difference signal PFD.

SUMMARY OF THE INVENTION

An object of the present invention is to provide a phase frequency detector for LCD capable of detecting a phase frequency difference between an external synchronous signal and a horizontal synchronous signal from the PLL with accuracy.

Another object of the present invention is to provide a method for detecting a phase frequency difference between an external synchronous signal and a horizontal synchronous signal from the PLL with accuracy by dividing the external synchronous signal and the horizontal synchronous signal and comparing the divided horizontal synchronous signa and the divided external synchronous signal.

According to an aspect of the present invention, there is provided to a phase frequency detection circuit of a phase locked loop (PLL) for liquid crystal display which compares a phase between an external synchronous signal and a horizontal synchronous signal from the PLL to generate a phase frequency difference signal, comprising:

a dividing means for dividing the external synchronous signal and the horizontal synchronous signal; a phase difference detecting means for detecting the phase difference between the divided external synchronous signal and the divided horizontal synchronous signal from the dividing means; a phase discriminating means for discriminating whether the phase of the divided external synchronous signal is ahead of that of the divided horizontal synchronous signal and generating the phase discriminating signal; and a comparison means for receiving the phase difference detection signal from the phase difference detection means and the phase discriminating signal from the phase discriminating means to generate the phase frequency difference signal.

In accordance with an embodiment of the present invention, the dividing means includes:

a first dividing means for dividing the external synchronous signal by two; and a second dividing means for dividing the horizontal synchronous signal by two. The first dividing means comprises:

a first flip flop which receives its inverted output signal as its input signal and is triggered at the negative edge of the external synchronous signal and generates the 2-divided external synchronous signal as an output signal to the phase difference detection means and the phase discriminating means; and a first inverter which inverts the output signal of the first flip flop and the inverted output signal is provided to the input signal of the first filp flop. The second dividing means comprises:

a second flip flop which receives its inverted output signal as its input signal and is triggered at the negative edge of the horizontal synchronous signal and generates the 2-divided horizontal synchronous signal as an output signal to the phase difference detection means and the phase discriminating means; and a second inverter which inverts the output signal of the second flip flop and the inverted output signal is provided to the input signal of the second flip flop.

The phase difference detection means comprises an exclusive NOR gate which receives the 2-divided external synchronous signal from the first dividing means and the 2-divided horizontal synchronous signal from the second dividing means and logically operates two signals to generate the phase difference detection signal to the comparison means.

The phase discriminating means comprises:

a first detection means for receiving the 2-divided external synchronous signal from the first dividing means and a master clock signal generated from the PLL and detecting the level transition of the 2-divided external synchronous signal at the positive edge of the master clock signal; a second detection means for receiving the 2-divided horizontal synchronous signal from the second dividing means and a master clock signal generated from the PLL and detecting the level transition of the 2-divided horizontal synchronous signal at the positive edge of the master clock signal; and a generation means for receiving output signals from the first and second detection means and discriminating the phase of the 2-divided external synchronous signal and the 2-divided horizontal synchronous signal to generate the phase discriminating signal to the comparison means.

The first detection means comprises:

a first flip flop which receives the 2-divided external synchronous signal from the first dividing means and the master clock signal generated from the PLL and is triggered at the positive edge of the master clock signal to delay the 2-divided external synchronous signal; and a first exclusive OR gate for logically operating the 2-divided external synchronous signal delayed from the first flip flop and the 2-divided external synchronous signal received from the first dividing means to detect the level transition of the 2-divided external synchronous signal.

The second detection means comprises:

a second flip flop which receives the 2-divided horizontal synchronous signal from the second dividing means and the master clock signal generated from the PLL and is triggered at the positive edge of the master clock signal to delay the 2-divided horizontal synchronous signal; and a second exclusive OR gate for logically operating the 2-divided horizontal synchronous signal delayed from the second flip flop and the 2-divided horizontal synchronous signal received from the second dividing means to detect the level transition of the 2-divided horizontal synchronous signal.

The generation means comprises a third flip flop which receives the output signal of the first exclusive OR gate as a clear signal and the output signal of the second exclusive OR gate as a clock signal and generates the phase discriminating signal as an output signal.

The comparison means comprises a three-state buffer which receives the phase difference detection signal from the phase difference detection means as a control signal and the phase discriminating signal as an input signal and generates the phase frequency difference signal.

And, there is provided to a phase frequency detection circuit of a phase locked loop (PLL) for liquid crystal display which compares a phase between an external synchronous signal and a horizontal synchronous signal from the PLL to generate a phase frequency difference signal, comprising:

a first dividing means for dividing the external synchronous signal; a second dividing means for dividing the horizontal synchronous signal; a phase difference detecting means for receiving the divided external synchronous signal from the first dividing means and the divided horizontal synchronous signal from the second the dividing means and detecting the phase difference between two signals to generate the phase difference detection signal; a phase the discriminating means for discriminating whether the divided external synchronous signal received from the first diving means is ahead of the divided horizontal synchronous signal received from the second dividing mens and generating the phase discriminating signal; and a comparison means for receiving the phase difference detection signal from the phase difference detection means and the phase discriminating signal from the phase discriminating means to generate the phase frequency difference signal.

According to another aspect of the present invention, there is provided to a method for comparing phase between an external synchronous signal as a reference signal and a horizontal synchronous signal as an input signal generated to detect a phase frequency difference in a phase-locked loop for a liquid crystal display, comprising the steps of:

dividing the external synchronous signal and the horizontal synchronous signal by two; detecting the phase difference of 2-divided signals to generate the phase difference detection signal; discriminating whether the phase of the 2-divided external synchronous signal is ahead of that of the 2-divided horizontal synchronous signal to generate the phase discriminating signal; and generating the phase frequency difference signal by controlling the generation of the phase discriminating signal with the phase difference detection signal.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

FIG. 4 is a diagram illustrating a phase frequency detection circuit in the prior art;

FIG. 5A through FIG. 5C are timing diagrams of the phase frequency detection circuit of FIG. 4.

DETAILED DESCRIPTION OF THE PREFERRED EMBODIMENT

Figure 1:
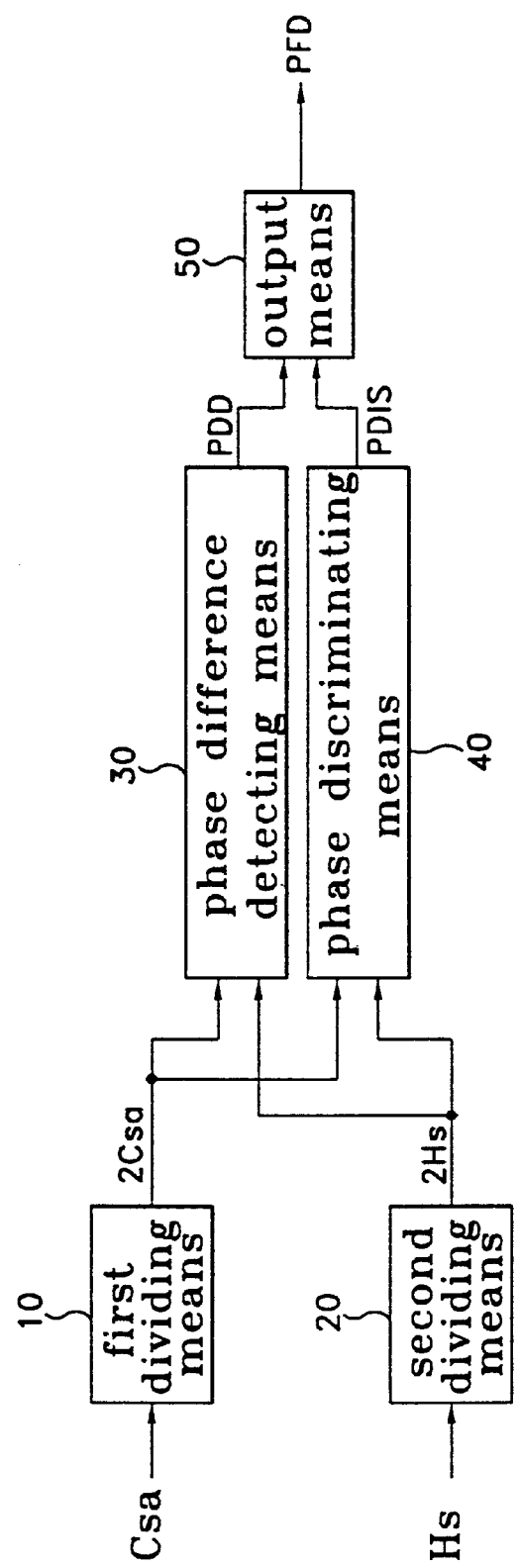
FIG. 1 is a block diagram of a phase frequency detection circuit in accordance with an embodiment of the present invention.
Figure 2:
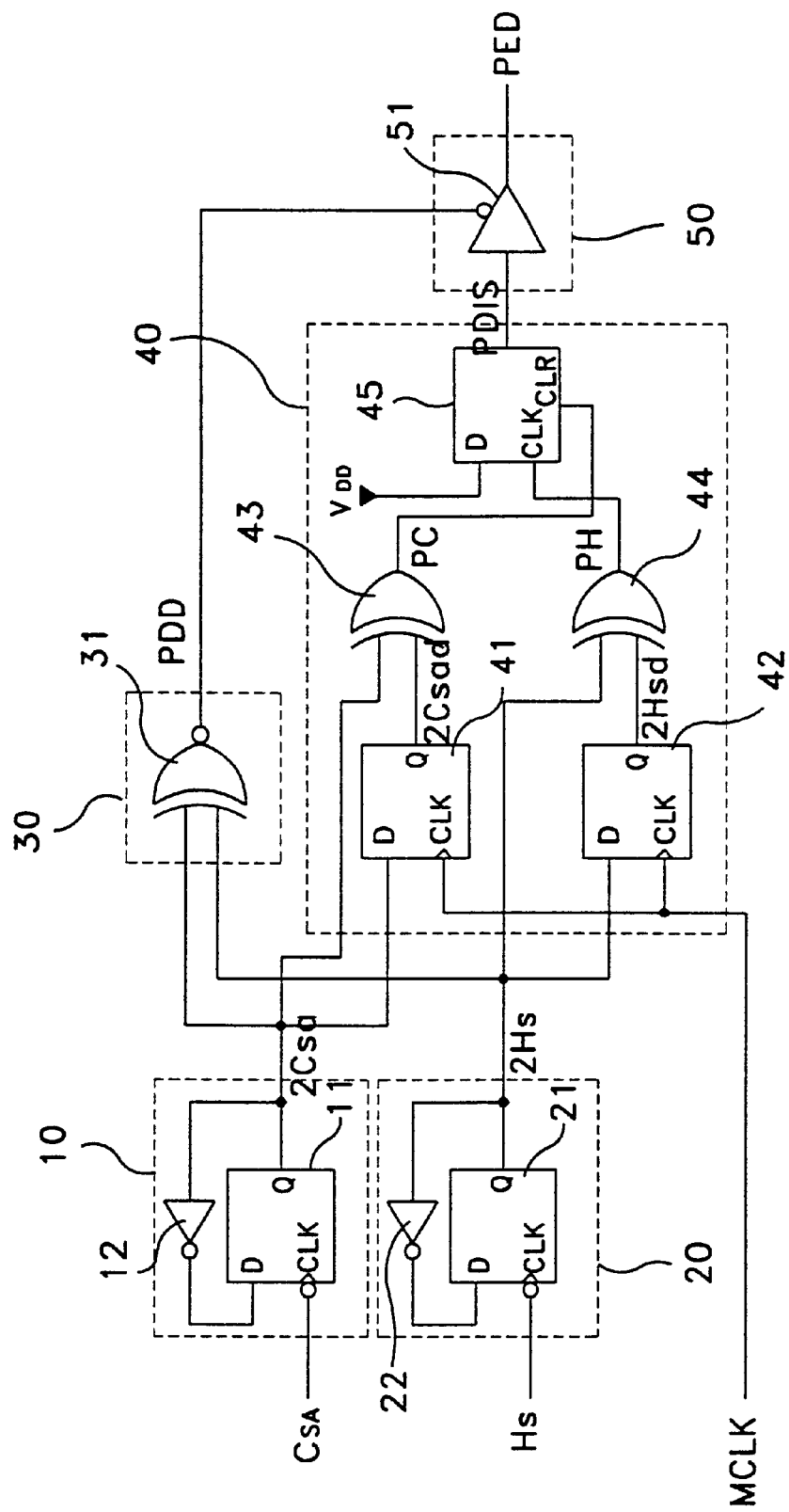
FIG. 2 is a detailed diagram of the phase frequency detection circuit of FIG. 2.

FIG. 1 is a block diagram of a phase frequency detection circuit in PLL for TFT-LCDs in accordance with an embodiment of the present invention. FIG. 2 is a detailed diagram of the phase frequency detection circuit of FIG. 1. The phase frequency detection circuit of the present invention includes a first dividing means 10, a second dividing means 20, a phase difference detecting means 30, a phase discriminating means 40 and an output means 50.

The first dividing means 10 which divides an external synchronous signal Csa as a reference signal by two, includes a D flip flop 11 which is triggered at the negative edge of the external synchronous signal Csa and which its inverted output signal is fed back to its input signal and an inverter 12 for inverting the output signal Q of the D flip flop 11 and providing the inverted output signal to the input signal of the D flip flop 11. The second dividing means 20 which divides a horizontal synchronous signal Hs as an input signal by two, includes a D flip flop 21 which is triggered at the negative edge of the horizontal synchronous signal Hs and which its inverted output signal is fed back to its input signal and an inverter 22 for inverting the output signal Q of the D flip flop 21 and providing the inverted output signal to the inpult signal of the D flip flop 21.

The phase difference detecting means 30 which detects the phase difference between the 2-divided external synchronous signal 2Csa from the first dividing means 10 and the 2-divided horizontal signal 2Hs from the second dividing means 20, includes an exclusive NOR gate 31 for logically operating the 2-divided external synchronous signal 2Csa and the 2-divided horizontal synchronous signal 2Hs to generating phase difference detection signal PDD.

The phase discriminating means 40 which discriminates whether the external synchronous signal is ahead of the horizontal synchronous signal Hs, includes a first detection means for receiving the divided external synchronous signal 2Csa and a master clock signal generated from the voltage controlled oscillator 400 of the PLL to detect the level transition of the divided external synchronous signal 2Csa, a second detection means for receiving the divided horizontal synchronous signal 2Hs and the master clock signal MCLK generated from the voltage controlled oscillator 400 of the PLL to detect the level transition of the divided horizontal synchronous signal 2Hs and a generation means for receiving the output signals of the first and second detection means to generate the phase discriminating signal PDIS between two signals 2Csa and 2Hs.

The first detection means includes a D flip flop 41 which the divided external synchronous signal 2Csa is provided as its input signal and is triggered at the positive edge of a master clock signal MCLK generated from the voltage controlled oscillator 400 of the PLL to delay the divided external synchronous signal 2Csa and an exclusive OR gate 43 for logically operating the divided external synchronous signal 2Csad delayed through the D filp flop 41 and the divided external synchronous signal 2Csa from the first dividing means 10.

The second detection means includes a D flip flop 42 which the divided horizontal synchronous signal 2Hs is provided as its input signal and is triggered at the positive edge of a master clock signal MCLK generated from the voltage controlled oscillator 400 of the PLL to delay the divided horizontal synchronous signal 2Hs and an exclusive OR gate 44 for logically operating the divided horizontal synchronous signal 2Hsd delayed through the D filp flop 42 and the divided horizontal synchronous signal 2Hs from the second dividing means 20.

The generation means includes a D flip flop which the output signal of the exclusive OR gate 43 in the first detection means is provided as its clear signal, the output signal of the exclusive OR gate 44 in the second detection means is provided as its clock signal, and generates the phase discriminating signal PDIS as its output signal to the comparison means 50.

The comparison means 50 which receives the phase difference detection signal PDD generated from the phase difference detecting means 30 and the phase discriminating signal PDIS generated from the phase discriminating means 40 and generates the phase frequency difference signal PFD, includes a three-state buffer 51 which receives the phase difference detection signal PDD as a control signal and the phase discriminating signal PDIS as an input signal to generate the phase frequency difference signal PFD.

Figure 3:
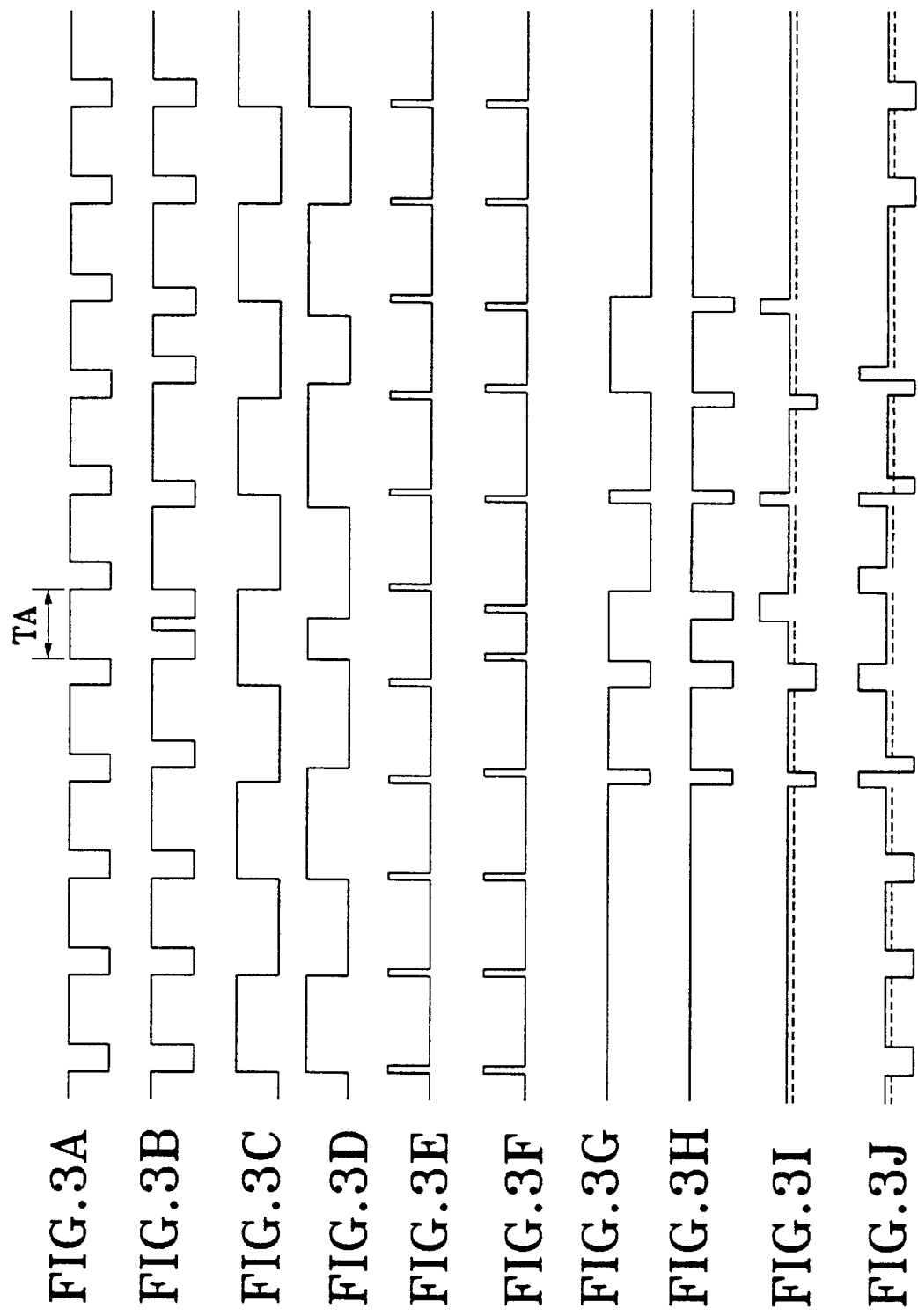
FIG. 3A through FIG. 3J are timing diagrams of the phase frequency detection circuit.
Figure 6:
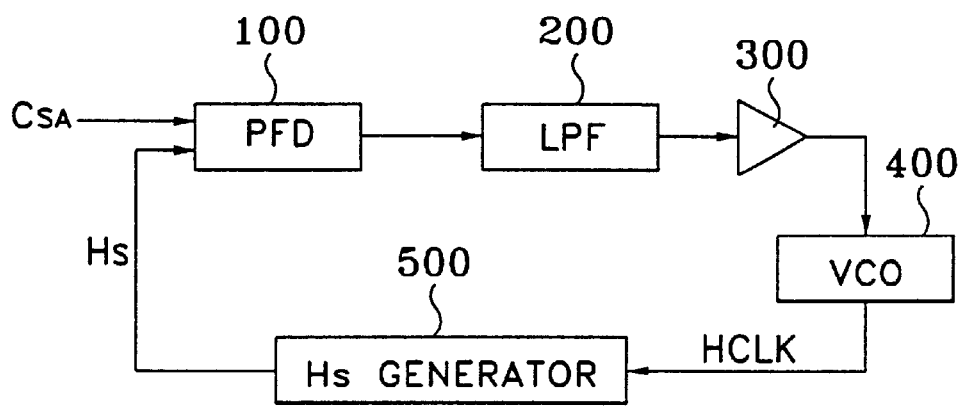
FIG. 6 is a circuit diagram of the conventional phase-locked loop (PLL) for LCDS.

The operation of the phase frequency detection circuit of the present invention having above configuration will be described with reference to the timing diagrams of FIG. 3A through FIG. 3J. The first dividing means 10 receives the external synchronous signal Csa as shown in FIG. 3A and divides it by two through the flip flop 11. The second dividing 20 receives the horizontal synchronous signal Hs as shown in FIG. 3B from the horizontal synchronous signal generator 500 and divides it by two through the flip flop 21.

The phase difference detector 30 receives the divided external synchronous signal 2Csa as shown in FIG. 3C and the divided horizontal synchronous signal 2Hs as shown in FIG. 3D and generates the phase difference detection signal PDD as shown in FIG. 3H to the comparison means 50.

The phase discriminating means 40 receives the 2-divided external synchronous signal 2Csa from the first dividing means 10 and the 2-divided horizontal synchronous signal 2Hs from the second dividing means 20 and discriminates whether the divided external synchronous signal 2Csa is ahead of the divided horizontal synchronous signal 2Hs. That is, the flip flop 41 is triggered at the positive edge of the master clock signal MCLK to delay the 2-divided external synchronous signal 2Csa received from the first dividing means 10 for a predetermined time, for example several nano seconds. The exclusive OR gate 43 logically operates the 2-divided external synchronous signal 2Csad delayed through the flip flop 41 and the 2-divided external synchronous signal 2Csa from the first dividing means 10 to detect the level transition of the 2-divided external synchronous signal 2Csa as shown in FIG. 3E.

Also, the flip flop 42 is triggered at the positive edge of the master clock signal MCLK to delay the 2-divided horizontal synchronous signal 2Hs received from the second dividing means 20 for a predetermined time, for example several nano seconds. The exclusive OR gate 44 logically operates the 2-divided horizontal synchronous signal 2Hsd delayed through the flip flop 42 and the 2-divided horizontal synchronous signal 2Hs from the second dividing means 20 to detect the level transition of the 2-divided horizontal synchronous signal 2Hs as shown in FIG. 3F.

The D flip flop 45 of the phase discriminating means 40 receives the output signal from the exclusive OR gate 43 as a clear signal CLR and the output signal from the exclusive OR gate 44 as a clock signal CLK to generate the phase discriminating signal PDIS as shown in FIG. 3G. That is, The phase discriminating means 40 generates the phase discriminating signal PDIS of low state in case where the divided external synchronous signal 2Csa is ahead of the divided horizontal synchronous signal 2Hs. Otherwise, the phase discriminating means 40 generates the phase discriminating signal PDIS of high state.

The comparison means 50 receives the phase difference detection signal PDD from the phase difference detection means 30 and the phase discriminating signal PDIS from the phase discriminating means 40 and compares the phase between two signals to generate the phase frequency difference signal PFD through the three-state buffer 51. That is, the three-state buffer 51 is enabled in the low state period of the phase difference detection signal PDD to output the phase discriminating signal PDIS and is disabled in the high state period of the phase difference detection signal PDD, thereby being high impedance state. Accordingly, the comparison means 50 generates the phase frequency difference signal PFD as result of the comparison of two input signals as shown in FIG. 3I.

Referring to timing diagrams of the phase frequency difference signal PFD of this invention in FIG. 3I and the phase frequency difference signal PFD of the prior art in FIG. 3J, the phase frequency detection circuit of this invention can detect the phase frequency difference PFD, even through the external synchronous signal Csa of low state is not overlapped with the horizontal synchronous signal Hs of low state as the period of TA.

According to the present invention, the phase frequency detection circuit can detect the phase frequency difference of two input signals with accuracy by dividing the external synchronous signal and the horizontal synchronous signal by two and comparing 2-divided input signals. As well, it can detect the phase frequency difference of two signals with accuracy in case where periods of two input signals are not equal.

The foregoing description shows only a preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. A phase frequency detection circuit of a phase locked loop (PLL) for liquid crystal display which compares a phase between an external synchronous signal and a horizontal synchronous signal from the PLL to generate a phase frequency difference signal, comprising:

a dividing means for dividing the external synchronous signal and the horizontal synchronous signal;

a phase difference detecting means for detecting the phase difference between the divided external synchronous signal and the divided horizontal synchronous signal from the dividing means;

a phase discriminating means for discriminating whether the divided external synchronous signal is ahead of the divided horizontal synchronous signal and generating the phase discriminating signal; and a comparison means for receiving the phase difference detection signal from the phase difference detection means and the phase discriminating signal from the phase discriminating means to generate the phase frequency difference signal.

2. The phase frequency detection circuit as claimed in claim 1, wherein the dividing means includes:

a first dividing means for dividing the external synchronous signal by two; and a second dividing means for dividing the horizontal synchronous signal by two.

3. The phase frequency detection circuit as claimed in claim 2, wherein the first dividing means comprises:

a first flip flop which receives its inverted output signal as its input signal and is triggered at the negative edge of the external synchronous signal and generates the 2-divided external synchronous signal as an output signal to the phase difference detection means and the phase discriminating means; and a first inverter which inverts the output signal of the first flip flop and the inverted output signal is provided to the input signal of the first filp flop.

4. The phase frequency detection circuit as claimed in claim 3, wherein the second dividing means includes:

a second flip flop which receives its inverted output signal as its input signal and is triggered at the negative edge of the horizontal synchronous signal and generates the 2-divided horizontal synchronous signal as an output signal to the phase difference detection means and the phase discriminating means; and a second inverter which inverts the output signal of the second flip flop and the inverted output signal is provided to the input signal of the second flip flop.

5. The phase frequency detection circuit as claimed in claim 2, wherein the phase difference detection means comprises an exclusive NOR gate which receives the 2-divided external synchronous signal from the first dividing means and the 2-divided horizontal synchronous signal from the second dividing means and logically operates two signals to generate the phase difference detection signal to the comparison means.

6. The phase frequency detection circuit as claimed in claim, 2, wherein the phase discriminating means comprises:

a first detection means for receiving the 2-divided external synchronous signal from the first dividing means and a master clock signal generated from the PLL and detecting the level transition of the 2-divided external synchronous signal at the positive edge of the master clock signal;

a second detection means for receiving the 2-divided horizontal synchronous signal from the second dividing meanns and a master clock signal generated from the PLL and detecting the level transition of the 2-divided horizontal synchronous signal at the positive edge of the master clock. signal; and a generation means for receiving output signals from the first and second detection means and discriminating the phase of the 2-divided external synchronous signal and the 2-divided horizontal synchronous signal to generate the phase discriminating signal to the comparison means.

7. The phase frequency detection circuit as claimed in claim 6, wherein the first detection means comprises:

a first flip flop which receives the 2-divided external synchronous signal from the first dividing means and the master clock signal generated from the PLL and is triggered at the positive edge of the master clock signal to delay the 2- divided external synchronous signal; and a first exclusive OR gate for logically operating the 2-divided external synchronous signal delayed from the first flip flop and the 2-divided external synchronous signal received from the first dividing means to detect the level transition of the 2-divided external synchronous signal.

8. The phase frequency detection circuit as claimed in claim 7, wherein the second detection means comprises:

a second flip flop which receives the 2-divided horizontal synchronous signal from the second dividing means. and the master clock signal generated from the PLL and is triggered at the positive edge of the master clock signal to delay the 2-divided horizontal synchronous signal; and a second exclusive OR gate for logically operating the 2-divided horizontal synchronous signal delayed from the second flip flop and the 2-divided horizontal synchronous signal received from the second dividing means to detect the level transition of the 2-divided horizontal synchronous signal.

9. The phase frequency detection circuit as claimed in claim 8, wherein the generation means comprises a third flip flop which receives the output signal of the first exclusive OR gate as a clear signal and the output signal of the second exclusive OR gate as a clock signal and generates the phase discriminating signal as an output signal.

10. The phase frequency detection circuit as claimed in claim 1, wherein the comparison means comprises a three-state buffer which receives the phase difference detection signal from the phase difference detection means as a control signal and the phase discriminating signal as an input signal and generates the phase frequency difference signal.

11. A phase frequency detection circuit of a phase locked loop (PLL) for liquid crystal display which compares a phase between an external synchronous signal and a horizontal synchronous signal from the PLL to generate a phase frequency difference signal, comprising:

a first dividing means for dividing the external synchronous signal;

a second dividing means for dividing the horizontal synchronous signal;

a phase difference detecting means for receiving the divided external synchronous signal from the first dividing means and the divided horizontal synchronous signal from the second the dividing means and detecting the phase difference between two signals to generate the phase difference detection signal;

a phase discriminating means for discriminating whether the divided external synchronous signal received from the first diving means is ahead of the divided horizontal synchronous signal received from the second dividing mens and generating the phase discriminating signal; and a comparison means for receiving the phase difference detection signal from the phase difference detection means and the phase discriminating signal from the phase discriminating means to generate the phase frequency difference signal.

12. The phase frequency detection circuit as claimed in claim 11, wherein the first dividing means comprises:

a first flip flop which receives its inverted output signal as its input signal and is triggered at the negative edge of the external synchronous signal and generates the divided external synchronous signal as an output signal to the phase difference detection means and the phase discriminating means; and a first inverter which inverts the output signal of the first flip flop and the inverted output signal is provided to the input signal of the first flip flop.

13. The phase frequency detection circuit as claimed in claim 12, wherein the second dividing means includes:

a second flip flop which receives its inverted output signal as its input signal and is triggered at the negative edge of the horizontal synchronous signal and generates the 2-divided horizontal synchronous signal as an output signal to the phase difference detection means and the phase discriminating means; and a second inverter which inverts the output signal of the second flip flop and the inverted output signal is provided to the input signal of the second flip flop.

14. The phase frequency detection circuit as claimed in claim 11, wherein the phase difference detection means comprises an exclusive NOR gate which receives the divided external synchronous signal from the first dividing means and the divided horizontal synchronous signal from the second dividing means and logically operates two signals to generate the phase difference detection signal to the comparison means.

15. The phase frequency detection circuit as claimed in claim 11, wherein the phase discriminating means comprises:

a first flip flop which receives the divided external synchronous signal from the first dividing means and a master clock signal generated from the PLL and is triggered at the positive edge of the master clock signal to delay the divided external synchronous signal;

a first exclusive OR gate for logically operating the divided external synchronous signal delayed from the first flip flop and the 2-divided external synchronous signal received from the first dividing means to detect the level transition of the divided external synchronous signal;

a second flip flop which receives the divided horizontal synchronous signal from the second dividing means and the master clock signal generated from the PLL and is triggered at the positive edge of the master clock signal to delay the divided horizontal synchronous signal;

a second exclusive OR gate for logically operating the divided horizontal synchronous signal delayed from the second flip flop and the divided horizontal synchronous signal received from the second dividing means to detect toe level transition of the divided horizontal synchronous signal; and a third flip flop which receives the output signal of the first exclusive OR gate as a clear signal and the output signal of the second exclusive OR gate as a clock signal and generates the phase discriminating signal as an output signal.

16. A method for detecting phase frequency difference between an external synchronous signal and a horizontal synchronous signal generated in a phase-locked loop for a liquid crystal display, comprises steps of:

dividing the external synchronous signal and the horizontal synchronous signal;

detecting the phase difference of two signals to generate the phase difference detection signal;

discriminating whether phase of the external synchronous signal is ahead of that of the horizontal synchronous signal to generate the phase discriminating signal; and generating the phase frequency difference signal by controlling the generation of the phase discriminating signal with the phase difference detection signal.

* * * * *